(12) United States Patent
Li et al.

(10) Patent No.: US 11,462,708 B2
(45) Date of Patent: Oct. 4, 2022

(54) ORGANIC LIGHT EMITTING DIODE, DISPLAY PANEL AND DISPLAY DEVICE

(71) Applicant: Yungu (Gu'an) Technology Co., Ltd., Langfang (CN)

(72) Inventors: Weiwei Li, Langfang (CN); Lin He, Langfang (CN); Mengzhen Li, Langfang (CN); Jingwen Tian, Langfang (CN); Tiantian Li, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 205 days.

(21) Appl. No.: 16/863,028

(22) Filed: Apr. 30, 2020

(65) Prior Publication Data

US 2020/0266379 A1 Aug. 20, 2020

Related U.S. Application Data

(63) Continuation of application No. PCT/CN2019/071943, filed on Jan. 16, 2019.

(30) Foreign Application Priority Data

Sep. 30, 2018 (CN) .......................... 201811160045.X

(51) Int. Cl.
*H01L 51/50* (2006.01)
*H01L 27/32* (2006.01)

(52) U.S. Cl.
CPC ...... *H01L 51/5096* (2013.01); *H01L 27/3244* (2013.01); *H01L 51/5008* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2015/0001499 | A1* | 1/2015 | Kim | ...................... H01L 51/504 257/40 |
| 2017/0301871 | A1* | 10/2017 | Li | ........................ H01L 51/0055 |
| 2020/0067007 | A1* | 2/2020 | Mou | .................... H01L 51/5004 |

FOREIGN PATENT DOCUMENTS

| | | |
|---|---|---|
| CN | 100505377 C | 6/2009 |
| CN | 101878552 A | 11/2010 |
| | (Continued) | |

OTHER PUBLICATIONS

ISR_for_International_Application_PCTCN2019071943.
(Continued)

*Primary Examiner* — Moin M Rahman
(74) *Attorney, Agent, or Firm* — Ladas & Parry LLP

(57) ABSTRACT

Disclosed are an organic light emitting diode, a display panel and a display device. The organic light emitting diode includes a first electrode, a second electrode, a light emitting layer and an electron blocking layer, the first electrode and the second electrode are disposed opposite to each other, the light emitting layer is disposed between the first electrode and the second electrode, the electron blocking layer is disposed between the light emitting layer and the first electrode. A LUMO level of the electron blocking layer is higher than a LUMO level of a light emitting host material in the light emitting layer, a first level difference between the
(Continued)

LUMO level of the electron blocking layer and the LUMO level of the light emitting host material in the light emitting layer is represented by A, where A≥0.4 eV.

12 Claims, 5 Drawing Sheets

(52) U.S. Cl.
CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 2251/552* (2013.01); *H01L 2251/558* (2013.01)

(56) References Cited

FOREIGN PATENT DOCUMENTS

| | | |
|---|---|---|
| CN | 103296207 A | 9/2013 |
| CN | 103477462 A | 12/2013 |
| CN | 106848084 A | 6/2017 |
| CN | 107146853 A | 9/2017 |
| CN | 106531769 A | 3/2018 |
| CN | 107749442 A | 3/2018 |
| WO | 2018/004187 A1 | 1/2018 |

OTHER PUBLICATIONS

First Chinese Office Action dated Jul. 31, 2019 by the State Intellectual Property Office of People's Republic of China for the corresponding Chinese Patent Application No. No. 201811160045.X, and an English Translation thereof.

Second Chinese Office Action dated Apr. 2, 2020 by the State Intellectual Property Office of People's Republic of China for the corresponding Chinese Patent Application No. No. 201811160045.X, and an English Translation thereof.

Taiwanese Office Action and an English Translation thereof for application 10821163140.

CN 106531769 A _ English Abstract.
CN 107749442 A _ English Abstract.
CN 103296207 A _ English Abstract.
CN 103477462 A _ English Abstract.
CN 106848084 A _ English Abstract.
CN 107146853 A _ English Abstract.
CN 100505377 C _ English Abstract.
CN 101878552 A _ English Abstract.

* cited by examiner

ORGANIC LIGHT EMITTING DIODE, DISPLAY PANEL AND DISPLAY DEVICE

CROSS-REFERENCE TO RELATED APPLICATIONS

This application is a continuation of International patent Application No. PCT/CN2019/071943 filed on Jan. 16, 2019, which claims priority to Chinese patent application No. 201811160045.X filed on Sep. 30, 2018, contents of both of which are incorporated herein by reference in their entireties.

TECHNICAL FIELD

The present application relates to the technical field of display, for example to an organic light emitting diode, a display panel, and a display device.

BACKGROUND

An organic light emitting diode (OLED) has self-luminous characteristics and does not require a backlight source. When the organic light emitting diode is applied to a display panel and a display device, the display panel and the display device have less overall thickness, which is advantageous for achieving the light and thin design of the display panel and the display device. Meanwhile, the organic light emitting diode has the advantages of high display luminance, wide viewing angle, high response speed and the like.

With the development of organic light emitting diode materials, a material of a light emitting layer having excellent performance in the organic light emitting diode is a material which tends to be of an electron transport type, but when the electron transport type material is used as the material of the light emitting layer, the organic light emitting diode has a short lifetime.

SUMMARY

The present application provides an OLED, a display panel and a display device, so as to increase the lifetime of the OLED.

The present application provides an OLED, which includes: a first electrode; a second electrode, which is disposed opposite to the first electrode; a light emitting layer, which is disposed between the first electrode and the second electrode; and an electron blocking layer, which is disposed between the light emitting layer and the first electrode, a lowest unoccupied molecular orbital (LUMO) level of the electron blocking layer is higher than a LUMO level of a light emitting host material in the light emitting layer, a first level difference between the LUMO level of the electron blocking layer and the LUMO level of the light emitting host material in the light emitting layer is represented by A, and A≥0.4 eV.

Furthermore, a highest occupied molecular orbital (HOMO) level of the electron blocking layer is higher than a HOMO level of the light emitting host material in the light emitting layer, a second level difference between the HOMO level of the electron blocking layer and the HOMO level of the light emitting host material in the light emitting layer is represented by B, and B≤0.2 eV.

Furthermore, a thickness of the electron blocking layer is represented by C, and 3 nm≤C≤20 nm.

Furthermore, the electron blocking layer includes aromatic amine derivative.

Furthermore, the OLED further includes: an intermediate doped layer, which is disposed between the light emitting layer and the electron blocking layer; where the intermediate doped layer includes a light emitting host material and an electron blocking material, and the light emitting host material in the intermediate doped layer is the same as the light emitting host material in the light emitting layer.

Furthermore, in the intermediate doped layer, a sum of a volume of the light emitting host material and a volume of the electron blocking material is represented by S, and the volume of the light emitting host material is represented by X, and 20%≤X/S≤80%.

Furthermore, a ratio of the volume of the light emitting host material to the volume of the electron blocking material is: X/S=50%.

Furthermore, a thickness of the intermediate doped layer is represented by E, and 0.1 nm≤E≤30 nm.

Furthermore, the thickness E of the intermediate doped layer is 5 nm, 10 nm or 20 nm.

Furthermore, the light emitting host material includes at least one of 4,4-N,N-dicarbazole biphenyl, 9,10-dinaphthylanthracene, 4,4',4''-N,N',N''-tris(3-phenylcarbazole)aniline, 3,5-N,N'-dicarbazole benzene, or 4,4'-N,N'-dicarbazole-2,2'-dimethylbiphenyl; the electron blocking material includes at least one of 4,4'-cyclohexylbis[N,N-bis(4-methylphenyl)aniline] or 4,4',4''-tris(carbazol-9-yl)triphenylamine.

Furthermore, the OLED further includes a first carrier function layer and a second carrier function layer; the first carrier function layer is disposed between the light emitting layer and the second electrode, and the second carrier function layer is disposed between the first electrode and the electron blocking layer.

Furthermore, the first carrier function layer includes an electron injection layer, an electron transport layer, and a hole blocking layer, the electron injection layer, the electron transport layer and the hole blocking layer are disposed in a stacked manner in a direction from the second electrode towards the light emitting layer; the second carrier function layer includes a hole injection layer and a hole transport layer, where the hole injection layer and the hole transport layer are disposed in a stacked manner in a direction from the first electrode towards the electron blocking layer.

The present application further provides a display panel, the display panel includes a substrate and multiple pixel units disposed on one side of the substrate and arranged in an array; where at least part of the multiple pixel units includes the above organic light emitting diode provided in the present application.

The present application further provides a display device, the display device includes the above display panel provided in the present application.

DETAILED DESCRIPTION

Figure 1:
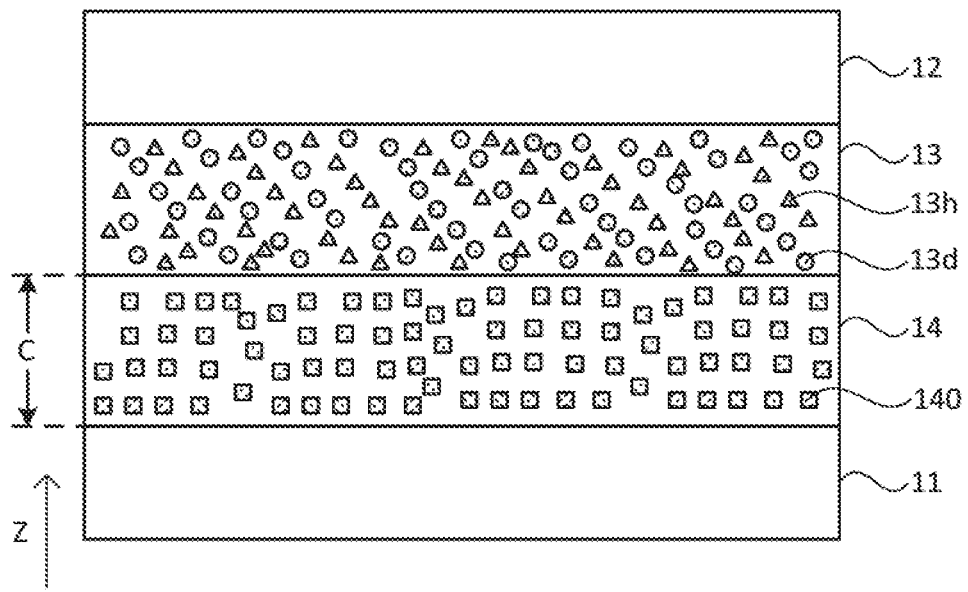
FIG. 1 is a schematic structural diagram of an organic light emitting diode provided in an embodiment of the present application.

The present disclosure will be further described in detail in conjunction with the accompanying drawings and embodiments below. It is to be understood that the specific embodiments described herein are merely illustrative of the present application and are not intended to limit the present application. In addition, it is also to be noted that, for convenience of description, only some but not all of the structures related to the present application are shown in the drawings.

In the related art, a material of a light emitting layer of an organic light emitting diode having excellent performance is a material which tends to be of an electron transport type. The organic light emitting diode further includes a first electrode and a second electrode disposed at both sides of the light emitting layer. Exemplarily, the first electrode may be an anode and the second electrode may be a cathode. When a driving current is supplied to the organic light emitting diode, electrons are injected from the second electrode into the light emitting layer, and holes are injected from the first electrode into the light emitting layer. Since the material of the light emitting layer is the material which tends to be of the electron transport type, the material of this light emitting layer facilitates the transport of electrons, a greater number of electrons reaching the light emitting layer is advantageous for improving the recombination efficiency of the electrons and holes, thereby improving the current efficiency of the organic light emitting diode. However, when a number of electrons is greater than a number of holes in the light emitting layer, the excess electrons may not be recombined, and the electrons that may not be recombined continue to be transported to one side close to the first electrode, thereby affecting the performance of an film layer on one side of the light emitting layer close to the first electrode, damaging an interface between the adjacent film layers, causing the performance of the film layer between the light emitting layer and the first electrode in the organic light emitting diode to be degraded, and causing an interface between the adjacent film layers in the multiple film layers between the light emitting layer and the first electrode to be damaged, thereby causing the lifetime of the organic light emitting diode to be reduced.

In view of the above, an embodiment of the present application provides an organic light emitting diode to improve the lifetime of the organic light emitting diode.

Figure 2:
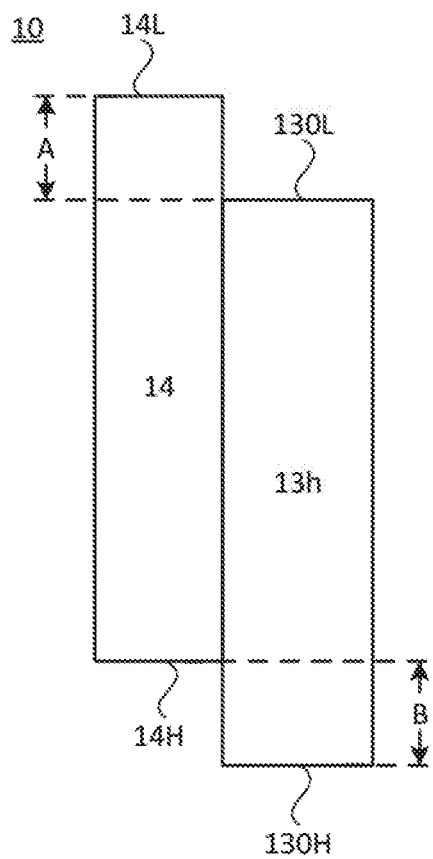
FIG. 2 is a schematic diagram of energy levels of an organic light emitting diode provided in an embodiment of the present application.

FIG. 1 is a schematic structural diagram of an organic light emitting diode provided in an embodiment of the present application, and FIG. 2 is a schematic diagram of energy levels of an organic light emitting diode provided in an embodiment of the present application. Reference is made to FIGS. 1 and 2, the organic light emitting diode 10 includes a first electrode 11, a second electrode 12, a light emitting layer 13 and an electron blocking layer 14, the first electrode 11 is disposed opposite to the second electrode 12, the light emitting layer 13 is disposed between the first electrode 11 and the second electrode 12, the electron blocking layer 14 is disposed between the light emitting layer 13 and the first electrode 11, a lowest unoccupied molecular orbital (LUMO) level 14L of the electron blocking layer 14 is higher than a LUMO level 130L of a light emitting host material 13*h* in the light emitting layer 13, a first level difference between the LUMO level 14L of the electron blocking layer 14 and the LUMO level 130L of the light emitting host material 13*h* in the light emitting layer 13 is represented by A, where A≥0.4 eV.

In the structure of the organic light emitting diode 10, the first electrode 11 may be an anode, exemplarily, an anode material may be Indium Tin Oxide (ITO). The second electrode 12 may be a cathode, exemplarily, a cathode material may be a metal material, such as aluminum (Al), gold (Au), silver (Ag), or a metal alloy including Ag, which is a conductive material having a low work function.

In the structure of the organic light emitting diode 10, the light emitting layer 13 may include a light emitting host material 13*h* and a light emitting guest material 13*d*, and the light emitting guest material 13*d* determines a light emitting color of the organic light emitting diode 10. Exemplarily, the light emitting guest material 13*d* may be 2-tert-butyl-4-(dicyanomethylidene)-6-[2-(1,1,7,7-tetramethyljulolidine-9-yl)ethylene]-4H-pyran (DCJTB), the light emitting color of the corresponding organic light emitting diode 10 thereof is red; or the light emitting guest material 13*d* may be N,N'-Dimethylquinacridone (DMQA), N,N'-Dibutylquinacridone (DBQA), 5,12-dibutyl-1,3,8,10-Tetramethylquinacridone (TMDBQA) or coumarin 545T(C545T), and the light emitting color of the corresponding organic light emitting diode 10 thereof is green; or the light emitting guest material 13*d* may be 4,4'-bis(9-ethyl-3-carbazolyl vinyl)-1,1'-biphenyl (BCzVBi), 4,4'-bis[4-(di-p-tolylamino)styryl] biphenyl (DPAVBi), 1,4-bis[4-(di-p-tolylamino)styryl] benzene (DPAVB), or 3,3'-(1,4-phenylbis-2,1-vinyl)bis(9-ethyl-9H-carbazole)(BCZVB), and the light emitting color of the corresponding organic light emitting diode 10 thereof is blue.

The materials of the first electrode 11, the second electrode 12, and the light emitting guest material 13*d* in the present embodiment are merely an exemplary illustration, and are not intended to limit the materials that may be used for the first electrode 11, the second electrode 12, and the light emitting guest material 13*d* in the organic light emitting diode 10 provided in the embodiments of the present application. In other embodiments, the materials of the first electrode 11, the second electrode 12, and the light emitting guest material 13*d* may be provided according to the actual requirements of the organic light emitting diode 10, which is not limited in the embodiments of the present application.

The light emitting principle of the organic light emitting diode 10 mainly includes four processes of carrier injection, carrier transport, carrier recombination, and exciton de-excitation light emitting.

In the carrier injection process, when a certain voltage is applied between the first electrode 11 (taking the anode as an example) and the second electrode 12 (taking the cathode as an example) of the organic light emitting diode 10, electrons of the cathode and holes of the cathode are injected into the LUMO level 130L and a highest occupied molecular orbital (HOMO) level 130H of the light emitting layer 13, respectively. During the carrier transport process, the injected electrons and holes are transported under the action of the electric field. In the carrier recombination process, electrons and holes are recombined by coulomb force in the light emitting layer 13, and thus excitons are generated. In the exciton de-excitation light emitting process, energy is released when the excitons return to a ground state, a part of the released energy is absorbed by the light emitting guest material 13d in the light emitting layer 13, the light emitting guest material 13d changes from the stable ground state to an unstable excited state, and light is emitted when the light emitting guest material 13d return from the excited state to the ground state.

The electron blocking layer 14 is disposed between the first electrode 11 and the light emitting layer 13, and the electron blocking layer 14 is configured to block the transport of electrons from the light emitting layer 13 to the side of the first electrode 11. The relationship between the LUMO level 14L of the electron blocking layer 14 and the LUMO level 130L of the light emitting layer 13 determines the strength of the electron blocking capability of the electron blocking layer 14. Exemplarily, on the basis of the LUMO level 130L of the light emitting layer 13, the higher the LUMO level 14L of the electron blocking layer 14 is, the stronger the electron blocking capability of the electron blocking layer 14 is. In the embodiments of the present application, the LUMO level 14L of the electron blocking layer 14 is set to be higher than the LUMO level 130L of the light emitting layer 13, and the first level difference between the LUMO level 14L of the electron blocking layer 14 and the LUMO level 130L of the light emitting layer 13 is represented by A, where A≥0.4 eV, the higher level difference between the LUMO level 130L of the light emitting layer 13 and the LUMO level 14L of the electron blocking layer 14 is operative to significantly block the transport of the electron towards the side of the first electrode 11, i.e., the electrons are confined in the light emitting layer 13, the probability of the electrons being transported from the light emitting layer 13 to the side of the first electrode 11 is reduced, and therefore the damage of electrons to an interface between the light emitting layer 13 and the electron blocking layer 14 may be slowed down, the influence of electrons on other film layers on one side of the light emitting layer 13 close to the first electrode 11 may be reduced, the performance degradation of the film layer itself and the interface between the adjacent film layers may be slowed down, and the lifetime of the organic light emitting diode 10 may be improved.

The relative magnitudes of the LUMO level and the HOMO level of the multiple film layers in the embodiments of the present application may be understood as follows: an level of an ionized state (an level with the lowest energy is called a ground state, and other levels are called excited states; a state that electrons are far away from atomic nuclei and are not subjected to the attraction force of the atomic nuclei is called an ionized state, and the level of the ionized state is 0) is taken as a reference level, an level which is closer to the reference level is a relatively high level, and an level which is far away from the reference level is a relatively low level.

In an embodiment, with continued reference to FIG. 2, the HOMO level 14H of the electron blocking layer 14 is higher than the HOMO level 130H of the light emitting host material 13h in the light emitting layer 13, a second level difference between the HOMO level 14H of the electron blocking layer 14 and the HOMO level 130H of the light emitting host material 13h in the light emitting layer 13 is presented by B, where B≤0.2 eV.

The electron blocking layer 14 is disposed to facilitate transport and injection of holes from the first electrode 11 into the light emitting layer 13, and the closer the HOMO level 14H of the electron blocking layer 14 is to the HOMO level 130H of the light emitting layer 13, the more advantageous the transport and injection of holes into the light emitting layer 13 is.

By the setting of the HOMO level 14H of the electron blocking layer 14 and the HOMO level 130H of the light emitting layer 13 above, the level difference between the HOMO level 14H of the electron blocking layer 14 and the HOMO level 130H of the light emitting layer 13 is smaller, and the hole injection capability is improved, i.e., more holes may be injected into the light emitting layer 13 and combined with more electrons, so that the recombination efficiency of the electron and hole is improved, and the probability of the transport of electron towards the side of the first electrode 11 is reduced, so that the damage of excess electrons to the interface between the light emitting layer 13 and the electron blocking layer 14 may be avoided, the influence of electrons on other film layers of the light emitting layer 13 close to the side of the first electrode 11 may be reduced, the performance degradation of the film layer itself and the interface between the adjacent film layers may be slowed down, and the lifetime of the organic light emitting diode 10 may be improved.

When the light emitting layer 13 includes the light emitting host material 13h and the light emitting guest material 13d, the HOMO level 130H of the light emitting layer 13 described above is understood as the HOMO level of the light emitting host material 13h in the light emitting layer 13.

In an embodiment, with continued reference to FIG. 1, the electron blocking layer 14 has a thickness C, where 3 nm≤C≤20 nm.

The thickness range is consistent with the thickness of the electron blocking layer of the organic light emitting diode in the related art. That is, the thickness of the electron blocking layer of the organic light emitting diode provided in the present embodiment is equal to that of the electron blocking layer of the organic light emitting diode in the related art, or the difference between the electron blocking layer of the organic light emitting diode provided in the present embodiment and the electron blocking layer of the organic light emitting diode in the related art is equal to or less than the preset thickness difference. Exemplarily, the difference in thickness between the electron blocking layer of the organic light emitting diode provided in the present embodiment and the electron blocking layer of the organic light emitting diode in the related art is equal to or less than 5 nm.

With such arrangement, a transport distance of holes in the electron blocking layer 14 may not be changed, and the optical properties of the electron blocking layer 14 (exemplarily, the optical properties may include an absorbance) may not be changed either, and thus, other film layers in the light emitting diode in the related art may be directly used without additional design, and thus, the design difficulty of the entire structure of the light emitting diode may be reduced.

In an embodiment, the electron blocking layer 14 includes an aromatic amine derivative. Exemplarily, the structure of the aromatic amine derivative may be any of multiple structures (H1) to (H19) shown below.

(H1)
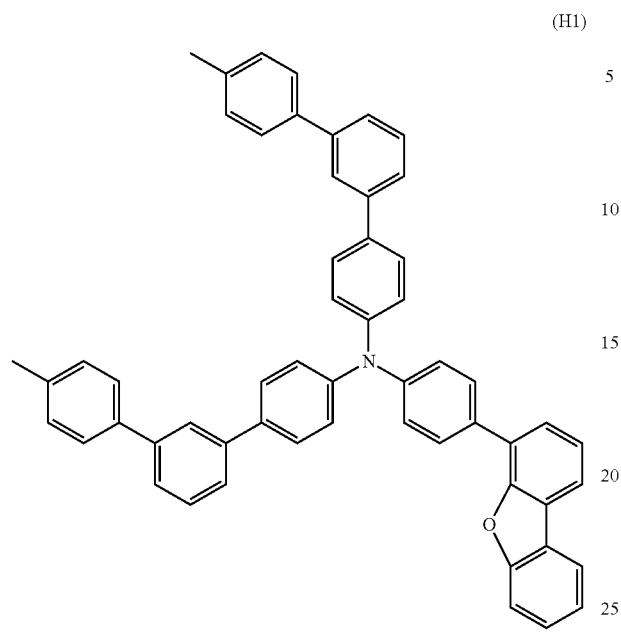
(H3)
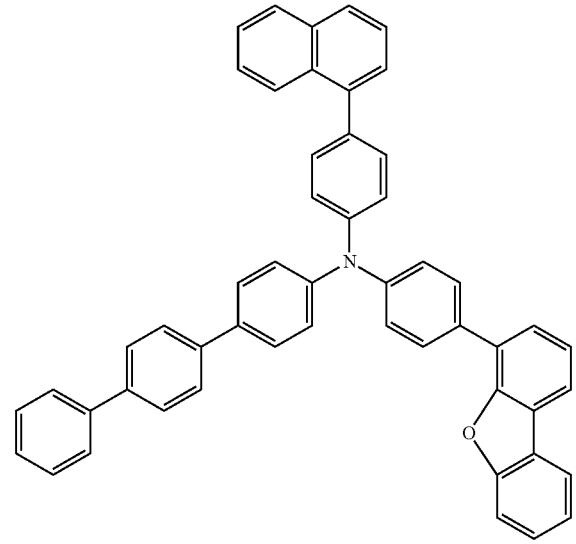
(H2)
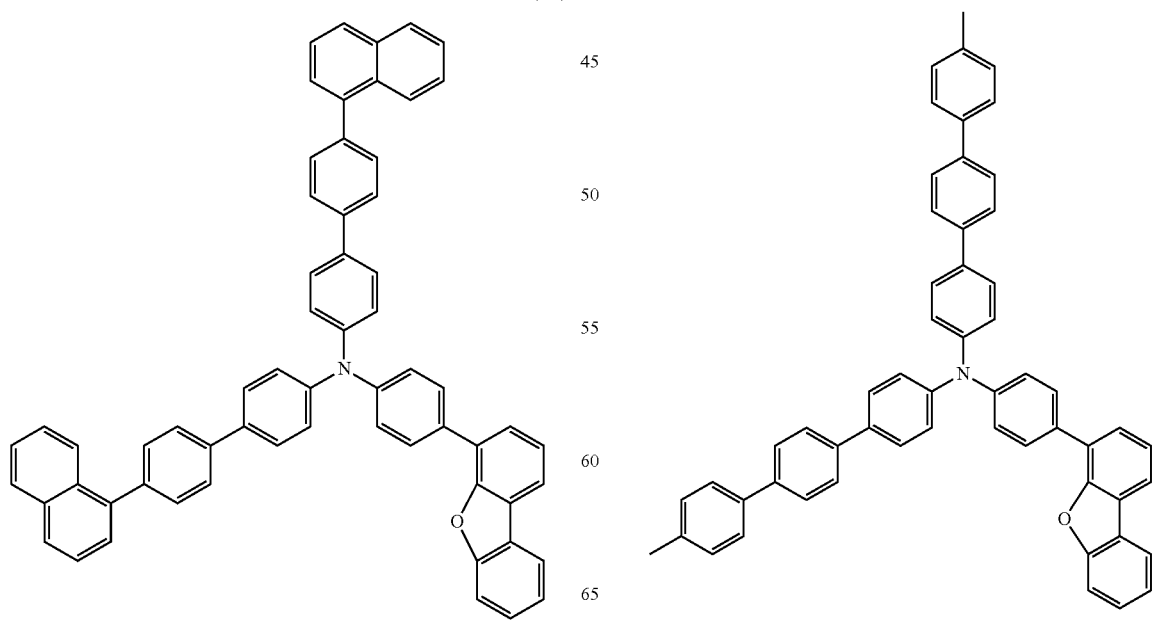
(H4)

(H5)
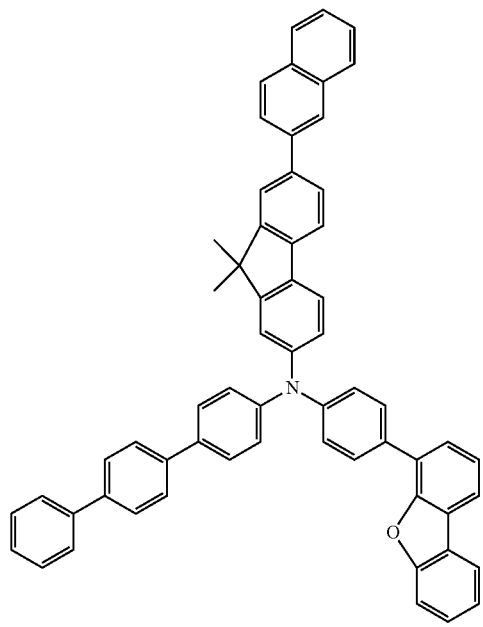
(H6)
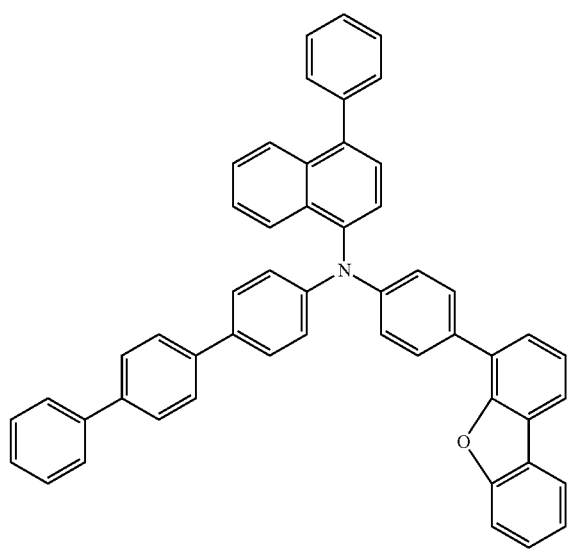
(H7)
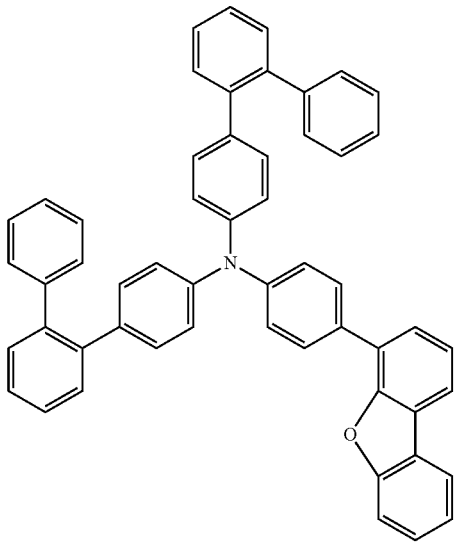
(H8)
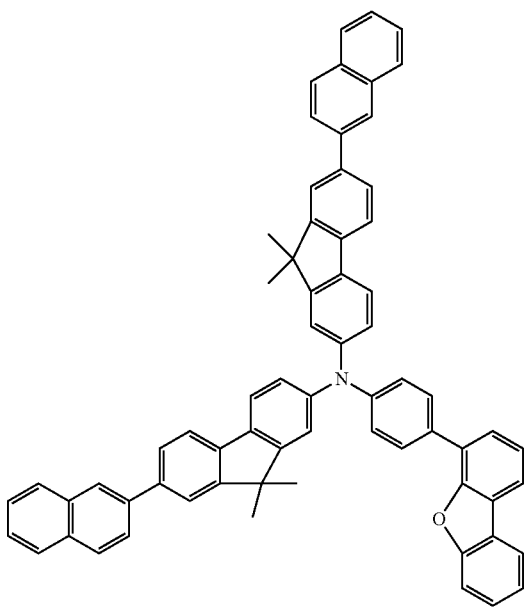
(H9)

(H10)
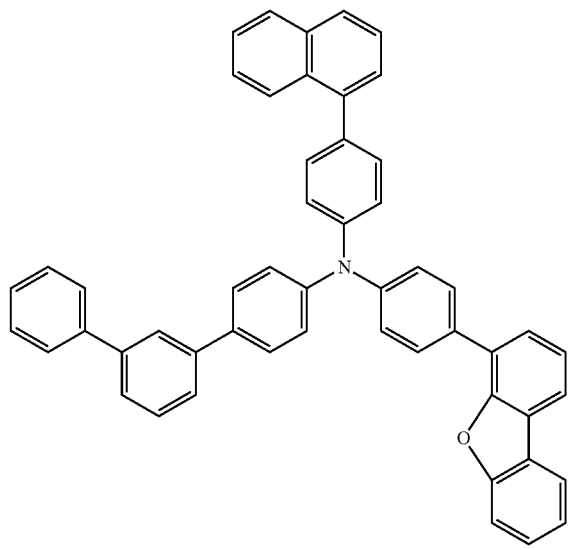
(H12)
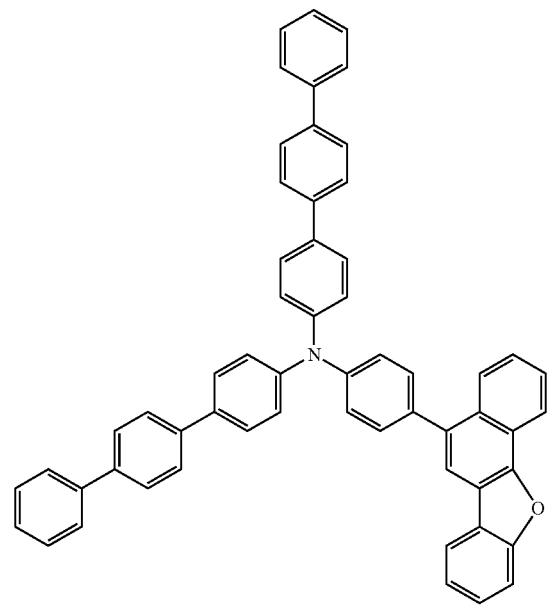
(H11)
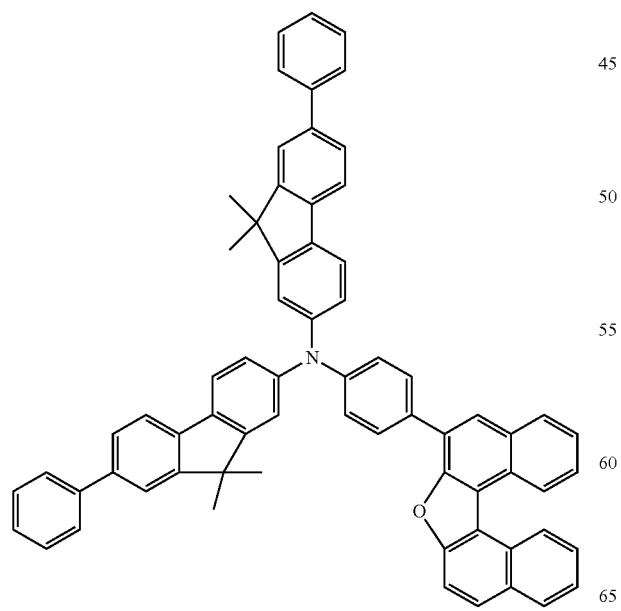
(H13)
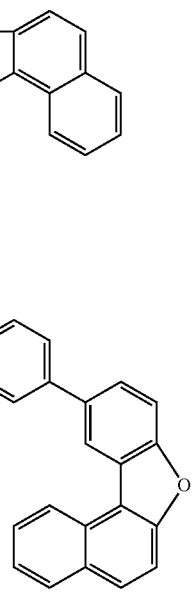

(H14)
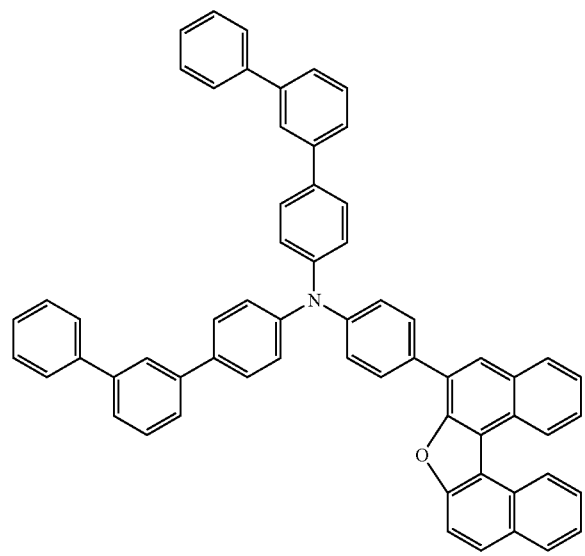
(H16)
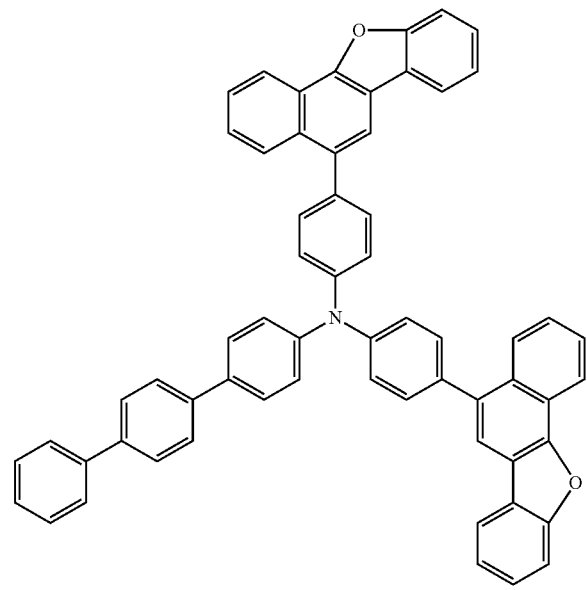
(H15)
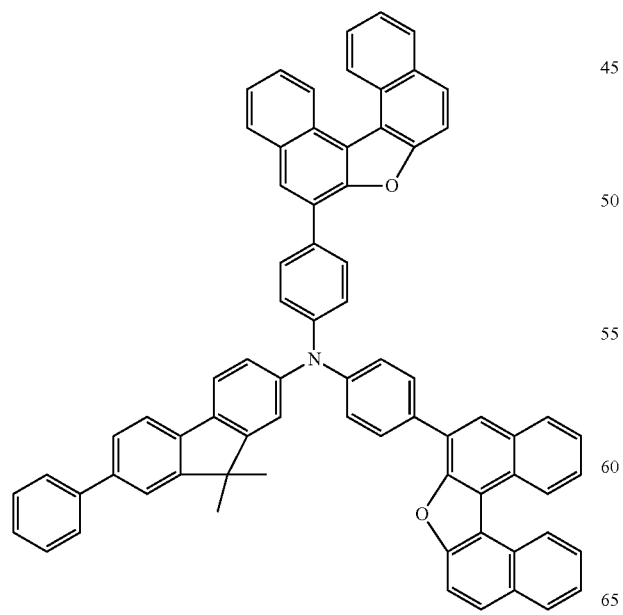
(H17)
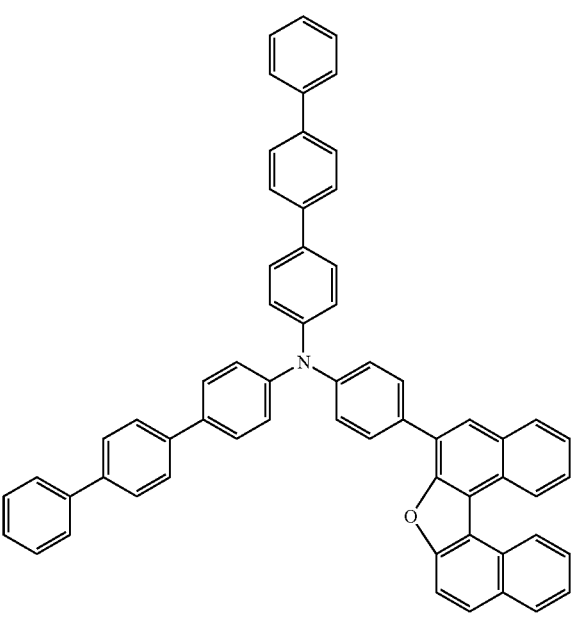

-continued
(H18)
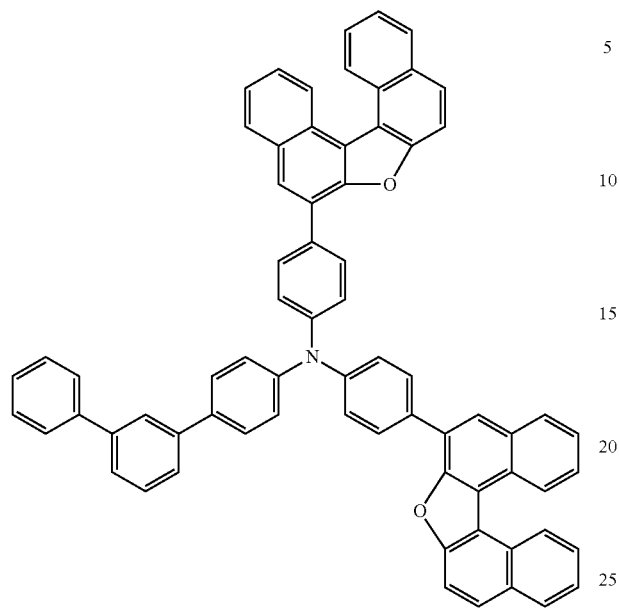
(H19)
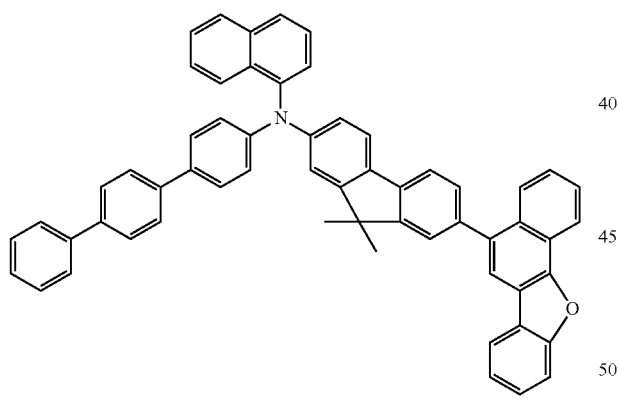
The general formula of the structural formulas (H1) to (H19) shown above is as follow:
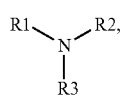
where N is a nitrogen atom, and R1, R2 and R3 represent three groups connected to the nitrogen atom.
R1 is any one of the following groups (J1) to (J7) and (J11) to (J12):
(J1)
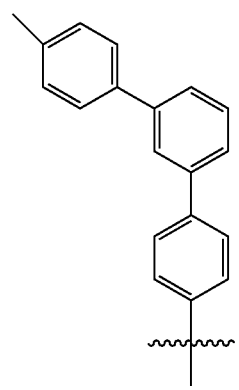
(J2)
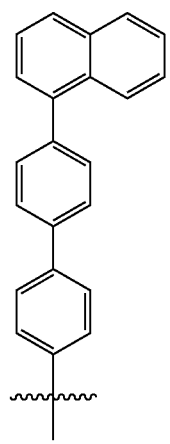
(J3)
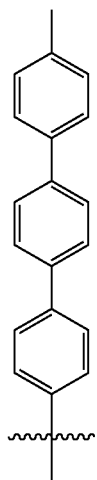

(J4)
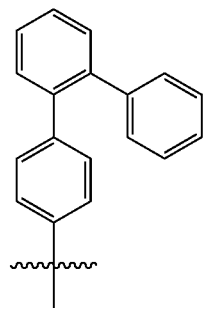
(J5)
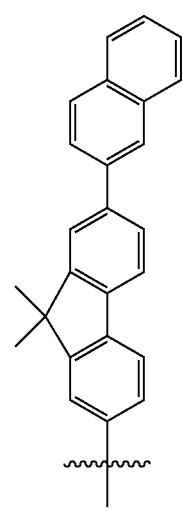
(J6)
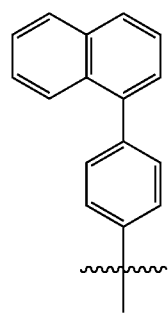
(J7)
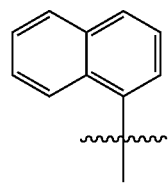
(J11)
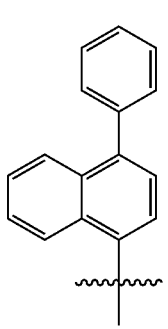
(J12)
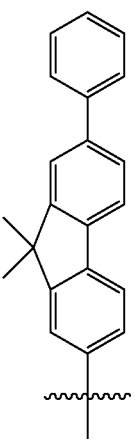
R3 is any one of the following groups (J8) to (J10) and (J13):
(J8)
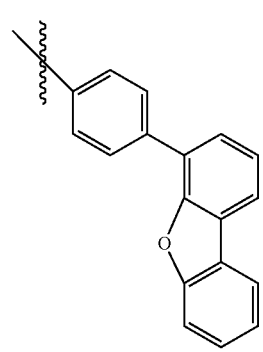
(J9)
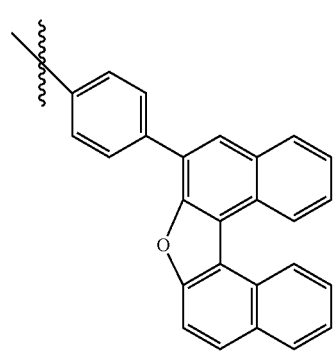
(J10)
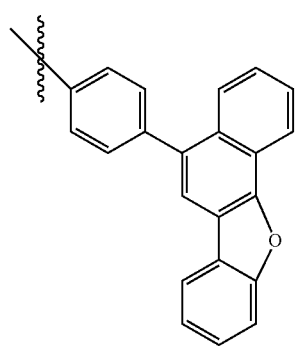

-continued

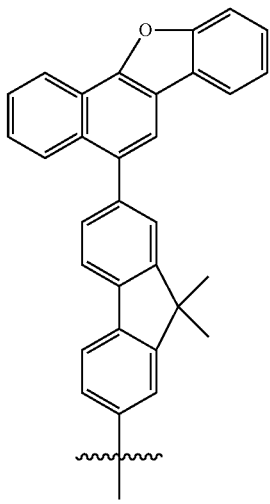
(J13)

R2 is any one of the above groups (J1) to (J13). In the above-mentioned multiple groups (J1) to (J13), the wavy line " ~ " represents a position at which the nitrogen atom is connected.

In the structure of the aromatic amine derivative described above, R2 may be the same group as R1, or R2 may be the same group as R3, or R1, R2 and R3 may be different groups from each other, which is not limited in the embodiments of the present application.

Dangling bonds in the above-illustrated multiple structures (H1) to (H19) may be connected to methyl, triphenylamine, or other groups known to those skilled in the art, which is not limited in the embodiments of the present application. Furthermore, the structures of several aromatic amine derivatives shown above are merely exemplary, and are not intended to limit the organic light emitting diode 10 provided in the present embodiment. In other embodiments, the electron blocking layer is provided to include other aromatic amine derivative structure materials known to those skilled in the art according to the actual requirements of the organic light emitting diode 10, which is not limited in the present application.

Next, the present embodiment exemplarily shows a set of tables comparing the light emitting characteristics of the OLED provided in the related art with those of the OLED provided in the present application, see table 1.

TABLE 1 table comparing the light emitting characteristics of the OLED provided in the related art with those of the OLED provided in the technical solution of the present application

| device | Op.V (V) | Eff (cd/A) | CIE (x) | CIE (y) | Peak (nm) | BI | LT97 (h) |
|---|---|---|---|---|---|---|---|
| D1 | 3.85 | 6.39 | 0.1435 | 0.0433 | 458 | 148 | 90 |
| D2 | 3.90 | 6.34 | 0.1448 | 0.0423 | 456 | 150 | 300 |

The device D1 represents an organic light emitting diode provided in the related art, the device D2 represents an organic light emitting diode provided in the present application, and the device D1 and the device D2 are the same in that: the first electrode is made of ITO, the thickness of the first electrode is 10 nm, and the work function of the first electrode is 4.3 eV; the thickness of the hole injection layer is 10 nm; the thickness of the hole transport layer is 120 nm; the thickness of the electron blocking layer is 5 nm; the thickness of the light emitting layer is 20 nm; the thickness of the hole blocking layer is 5 nm; the thickness of the electron transport layer is 30 nm; the thickness of the electron injection layer is 1 nm; the second electrode is made of a metal electrode material and has a thickness of 13 nm to 20 nm. The device D1 and the device D2 are different in that: the electron blocking layer of the device D1 is made of TPD, the level difference between the LUMO level of the electron blocking layer of the device D1 and the LUMO level of the light emitting layer is 0.3 eV, and the level difference between the HOMO level of the electron blocking layer of the device D1 and the HOMO level of the light emitting layer is 0.4 eV, the material of the electron blocking layer of the device D2 is a material represented by the structure (H19), that is,

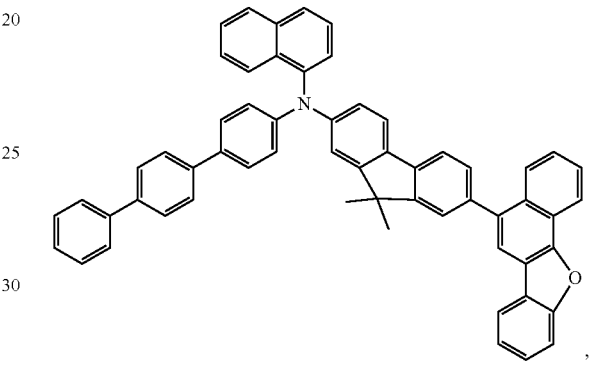

the level difference between the LUMO level of the electron blocking layer of the device D2 and the LUMO level of the light emitting layer is 0.45 eV, and the level difference between the HOMO level of the electron blocking layer of the device D2 and the HOMO level of the light emitting layer is 0.2 eV. The light emitting characteristics of the two devices were tested on the basis of the film layer structures of the device D1 and the device D2, and the luminance was required to be 1200 candelas per square meter (cd/cm$^2$), and the test results shown in table 1 were obtained.

Op.V represents a working voltage in volt (V); Eff represents the current efficiency in candelas per ampere (cd/A); CIE (x) and CIE (y) represent color coordinates; Peak represents a peak position of a light emitting spectrum of the organic light emitting diode 10 in nanometers (nm); BI represents a blue light factor, and may be obtained by dividing current efficiency by the color coordinate CIE (y), where the larger the blue light factor is, the better the device performance is; LT 97 represents the lifetime of the organic light emitting diode 10 in hours (h), LT 97 represents the lifetime value of the device obtained by performing a constant current test at 1200 candelas per square meter (cd/cm$^2$).

Figure 3:
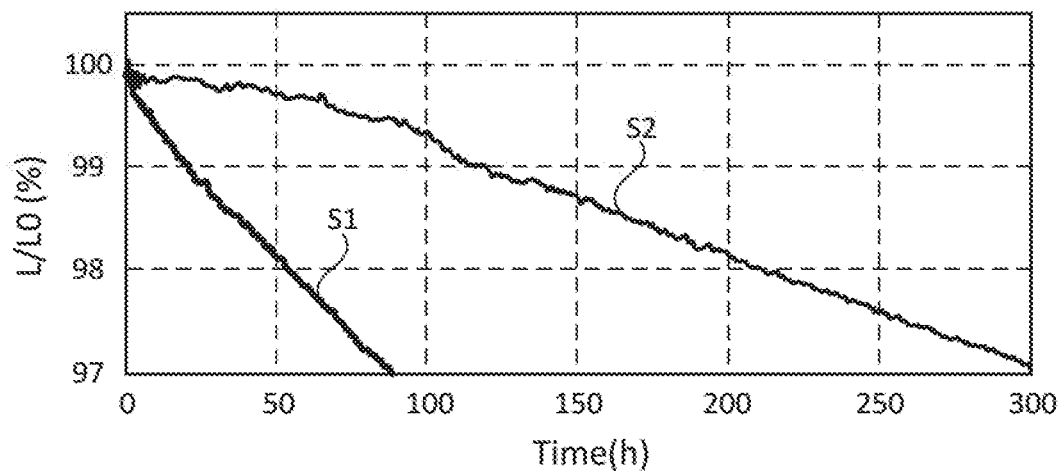
FIG. 3 is a graph of a luminance decay curve of an organic light emitting diode provided in an embodiment of the present application compared to a luminance decay curve of an organic light emitting diode provided in the related art.

FIG. 3 is a graph comparing a luminance decay curve of an organic light emitting diode provided in an embodiment of the present application with a luminance decay curve of an organic light emitting diode provided in the related art, and is used to derive the lifetime values shown in table 1. Reference is made to FIG. 3, the abscissa represents the light emitting Time in hours (h); the ordinate represents the ratio L/L0 of the luminance corresponding to a different light emitting moment to the initial luminance, where the unit is 100%, and the initial luminance is 1200 candelas per square meter (cd/cm²); S1 represents the luminance decay curve of the device D1, and S2 represents the luminance decay curve of the device D2. The lifetime of the device in the present embodiment is defined as the time of light emitting corresponding to when the luminance of the device decays to 97% of the initial luminance. As may be seen from FIG. 3, when the luminance of the device D1 decays to 97% of the initial luminance, i.e., the ordinate L/L0 changes from 100% to 97%, the corresponding light emitting time is 90 hours; when the luminance of the device D2 decays to 97% of the initial luminance, the corresponding light emitting time is 300 hours, i.e., the lifetime values of the device D1 and the device D2 shown in table 1 are obtained.

As may be seen from the comparison data of the light emitting characteristics of the organic light emitting diode given in table 1, by changing the material of the electron blocking layer in the structure of the light emitting diode 10 to the material with strong electron blocking capability and electron impact resistance capability proposed in the embodiments of the present application, the performance of the device D1 and the device D2 in terms of operating voltage, current efficiency, color coordinate, peak position and blue light factor are substantially consistent; in terms of lifetime, the lifetime of the device is increased from 90 h for device D1 to 300 h for device D2. Therefore, compared with the related art, the present application may increase the lifetime of the organic diode 10 from 90 h to 300 h on the premise of ensuring that other light emitting characteristics of the organic diode 10 are basically unchanged, i.e., the lifetime is increased by 2.3 times.

The comparison of the device D1 and the device D2 is merely an exemplary illustration of the organic light emitting diode 10 provided in the embodiments of the present application and is not limiting.

Figure 4:
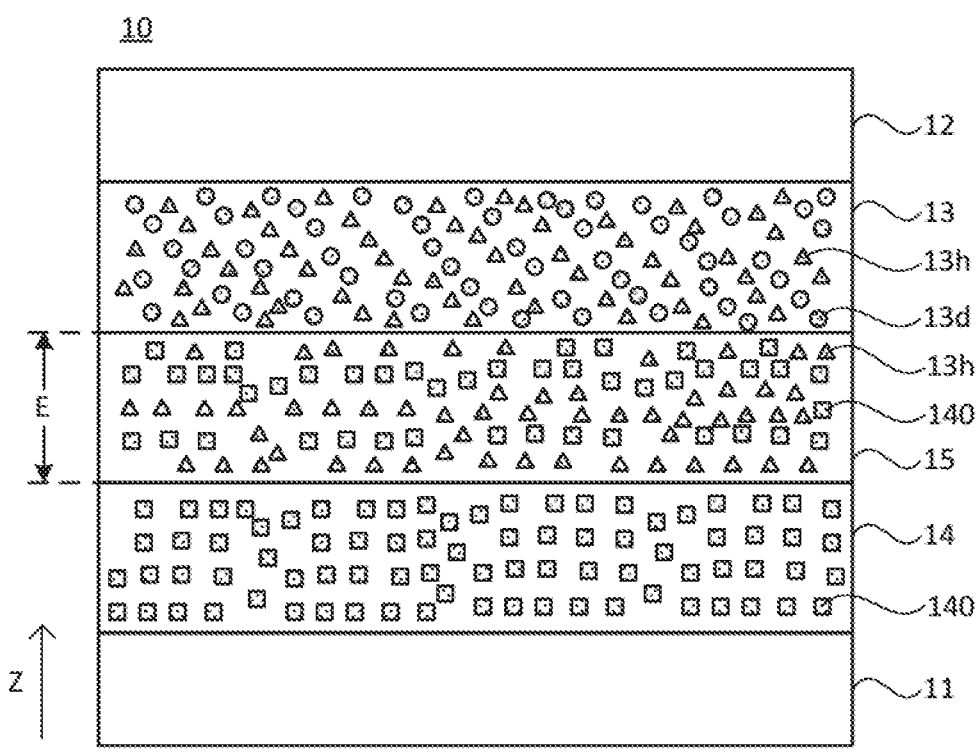
FIG. 4 is a schematic structural diagram of another organic light emitting diode provided in an embodiment of the present application.

FIG. 4 is a schematic structural diagram of another organic light emitting diode provide in an embodiment of the present application. Reference is made to FIG. 4, the organic light emitting diode 10 further includes an intermediate doped layer 15 which is disposed between the light emitting layer 13 and the electron blocking layer 14, the intermediate doped layer 15 includes a light emitting host material 13$h$ and an electron blocking material 140, and the light emitting host material 13$h$ in the intermediate doped layer 15 is the same as the light emitting host material 13$h$ in the light emitting layer 13.

Since the intermediate doped layer 15 and the light emitting layer 13 have the same light emitting host material, the difference in HOMO levels between the intermediate doped layer 15 and the light emitting layer 13 is smaller, and the intermediate doped layer 15 may serve as a transition layer of the HOMO levels between the first electrode 11 and the light emitting layer 13 (it may also be understood that the intermediate doped layer 15 serves as a transition layer of the HOMO levels between the light emitting layer 13 and the electron blocking layer 14), the difference in HOMO levels between the adjacent layers may be reduced, and the hole injection capability may be improved. In addition, the intermediate doped layer 15 is provided to increase an exciton recombination region (i.e., the region where electrons and holes are recombined), and to avoid the exciton recombination region from deviating to the side of the first electrode 11 to damage the electron blocking layer 14. The electron blocking material 140 in the intermediate doped layer 15 may block electrons from being transported from the light emitting layer 13 to the side of the first electrode 11, so that the excessive electrons may be significantly prevented from reaching the first electrode 11 to form a leakage current, and the damage of the electrons to the electron blocking layer 14 and to the interfaces between the other film layers between the light emitting layer 13 and the first electrode 11 and the adjacent film layers may be avoided, thereby improving the lifetime of the organic light emitting diode 10. In addition, the light emitting efficiency of the organic light emitting diode 10 may be significantly improved by improving the hole injection capability, increasing the exciton recombination region and avoiding the formation of the leakage current, and the lifetime of the organic light emitting diode 10 may be further improved.

In an embodiment, the intermediate doped layer 15 may be in an co-evaporated or a premixed form upon evaporation plating, the co-evaporated, i.e., in which the composition of the intermediate doped layer 15 are respectively placed in corresponding crucibles for evaporation plating, the premixed, i.e., in which the composition of the intermediate doped layer 15 is mixed in the same crucible for evaporation plating, the advantage of adopting the premixed evaporation plating is in that a number of crucibles can be saved.

In an embodiment, a volume of the light emitting host material 13$h$ in the intermediate doped layer 15 and a volume of the electron blocking material 140 satisfy the following relationship: the sum of the volume of the light emitting host material 13$h$ and the volume of the electron blocking material 140 is denoted as S, and the volume of the light emitting host material 13$h$ is denoted as X, where $20\% \leq X/S \leq 80\%$.

The larger the ratio (i.e., X/S, hereinafter simply referred to as "ratio") of the volume of the light emitting host material 13$h$ to the total volume of the material of the intermediate doped layer 15 (i.e., the sum of the volume of the light emitting host material 13$h$ and the volume of the electron blocking material 140), the closer the compositions of the constituent materials of the intermediate doped layer 15 and the light emitting layer 13 are, and the closer the HOMO levels of the intermediate doped layer 15 and the light emitting layer 13 are; the greater the proportion of the volume of the electron blocking material 140 to the total volume of the material of the intermediate doped layer 15, the stronger the electron blocking capability of the intermediate doped layer 15. Therefore, the proportion of the light emitting host material 13$h$ may be selected according to the difference in HOMO levels between the first electrode 11 and the light emitting layer 13 in the organic light emitting diode 10 and the difference in electron transport capability and hole injection capability, so that the difference in HOMO levels between the first electrode 11 and the light emitting layer 13 may be buffered by the intermediate doped layer 15, the hole injection capability is improved, and the electrons can also be significantly blocked from being transported toward the side of the first electrode 11. The embodiments of the present application merely exemplarily show that the ratio X/S of the light emitting host material 13$h$ is $20\% \leq X/S \leq 80\%$ and is not intended to limit the organic light emitting diode 10 provided in the embodiments of the present application. In other embodiments, the proportion of the light emitting host material 13$h$ in the intermediate doped layer 15 may be set according to the actual requirements of the organic light emitting diode 10, and exemplarily, the proportion may be $40\% \leq X/S \leq 70\%$ or $30\% \leq X/S \leq 50\%$.

When the proportion of the light emitting host material 13$h$ is greater than 50%, the light emitting host material 13$h$ is a host material of the intermediate doped layer 15, and the electron blocking material is a guest material of the intermediate doped layer 15; when the proportion of the light emitting host material 13h is less than 50%, the light emitting host material 13h is a guest material of the intermediate doped layer 15, and the electron blocking material is a host material of the intermediate doped layer 15. The intermediate doped layer 15 may be prepared by selecting a corresponding preparation process according to different material ratios, which is not particularly limited in the embodiments of the present application.

In an embodiment, the proportion of the light emitting host material 13h is 50%. With such arrangement, on one hand, the HOMO level of the intermediate doped layer 15 is ensured to be relatively close to the HOMO level of the light emitting layer 13, and the HOMO level difference between an anode 21 and the light emitting layer 13 is better buffered, and on the other hand, the intermediate doped layer 15 is ensured to have a strong electron blocking capability, and may significantly block electrons, so that the comprehensive performance of the intermediate doped layer 15 is relatively good.

In an embodiment, a thickness of the intermediate doped layer 15 is represented by E, where 0.1 nm≤E≤30 nm.

In the embodiments of the present application, the first electrode 11 and the second electrode 12 of the organic light emitting diode 10 form an optical microresonator, i.e., an optical microcavity. The sum of the thicknesses of the first electrode 11, the second electrode 12 and the respective film layers between the first electrode 11 and the second electrode 12 is equal to a cavity length of the optical microcavity. In the optical microcavity, when a wavelength λ of the light satisfies a formula $$L_{eff} = \sum_m n_m d_m \cos\theta_0 + |\Phi_1(\lambda)|\lambda/4\pi + |\Phi_2(\lambda)|\lambda/4\pi,$$

a light emitting intensity of the light is enhanced, and the light emitting intensity of the light with other wavelengths are will be weakened. In the formula, $k^*\lambda=2L_{eff}$, k is microcavity series, $n_m$ and $d_m$ are refractive index and thickness of the $m_{th}$ layer in the microcavity, respectively, $\theta_0$ is light emitting angle, Leff is effective optical path, and $\Phi_1(\lambda)$ and $\Phi_2(\lambda)$ are reflection phase shift of the first electrode 11 and the second electrode 12, respectively. The thickness E of the intermediate doped layer 15 may be adjusted according to the wavelength of the light emitted by the light emitting layer 13 of the organic light emitting diode 10, so that the cavity length of the optical microcavity of the organic light emitting diode 10 satisfies the above formula, and therefore the light emitted by the organic light emitting diode 10 satisfies the color requirement of the organic light emitting diode 10. Exemplarily, the thickness E of the intermediate doped layer 15 may be set to 5 nm, 10 nm, 20 nm, or the like.

By setting the thickness E of the intermediate doped layer 15 to be 0.1 nm≤E≤30 nm, it is possible to ensure that the organic light emitting diode 10 has a smaller thickness, thereby ensuring that the display panel has a smaller thickness when the organic light emitting diode is applied to the display panel.

In an embodiment, the light emitting host material 13h includes at least one of 4,4-N,N-dicarbazole biphenyl, 9,10-dinaphthylanthracene, 4,4',4''-N,N',N''-tris(3-phenylcarbazole)aniline, 3,5-N,N-dicarbazole benzene, or 4,4'-N,N'-dicarbazole-2,2'-dimethylbiphenyl;

the electron blocking material 140 includes at least one of 4,4'-cyclohexylbis[N,N-bis(4-methylphenyl)aniline] or 4,4',4''-tris(carbazol-9-yl)triphenylamine.

The above-mentioned examples are only illustrative of several light emitting host materials 13h with blue light emitting color and several electron blocking materials 140, and are not intended to limit the organic light emitting diode 10 provided in the embodiments of the present application. In other embodiments, the light emitting host material 13h and the electron blocking material 140 in the intermediate doped layer 15 may also be provided according to the actual requirements of the organic light emitting diode 10. Exemplarily, N,N,-diphenyl-N,N,-(1-naphthyl)-1,1'-biphenyl-4,4'-diamine(NPB), 1,3,5-tri(1-Phenyl-1H-benzimidazol-2-yl)benzene(TPBi) may also be used as the electron blocking material, which is not limited in the embodiments of the present application.

Figure 5:
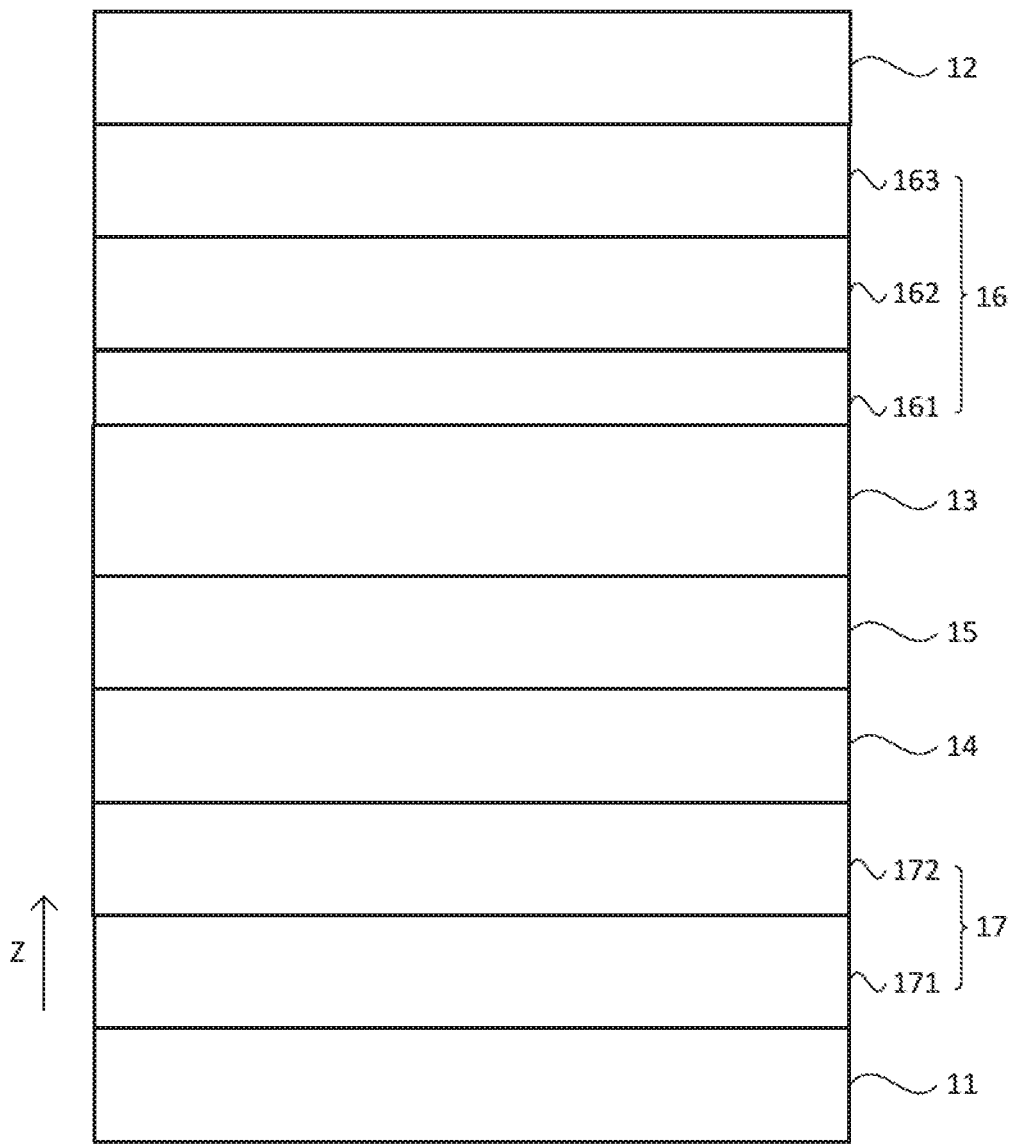
FIG. 5 is a schematic structural diagram of another organic light emitting diode provided in an embodiment of the present application.

FIG. 5 is a schematic structural diagram of another organic light emitting diode provided in an embodiment of the present application. Reference is made to FIG. 5, the organic light emitting diode 10 may further include a first carrier function layer 16 and a second carrier function layer 17. The first carrier function layer 16 is disposed between the light emitting layer 13 and the second electrode 12, and the second carrier function layer 17 is disposed between the first electrode 11 and the electron blocking layer 14.

The first carrier function layer 16 may be an electron-type auxiliary function layer which is used to improve the efficiency of electrons in terms of the transport and injection and to block holes from being transported from the light emitting layer 13 towards the side of the second electrode 12. The first carrier function layer 16 may have a multi-layer structure, and exemplarily, may include an electron injection layer 163, an electron transport layer 162 and a hole blocking layer 161. The second carrier function layer 17 may be a hole-type auxiliary function layer which is used to improve the efficiency of holes in terms of the transport and injection. The second carrier function layer 17 may also have a multi-layer structure, and exemplarily, may include a hole injection layer 171 and a hole transport layer 172.

The first carrier function layer 16 and the second carrier function layer 17 may be made of any one or more materials known to those skilled in the art, which is not limited in the embodiments of the present application.

In an embodiment, the organic light emitting diode 10 may further include a light extraction layer, the light extraction layer is disposed on a light emitting side of the organic light emitting diode 10, for improving the light emitting efficiency. The structure of the light extraction layer may be any one of structures known to those skilled in the art, which is not limited in the embodiments of the present application.

Figure 6:
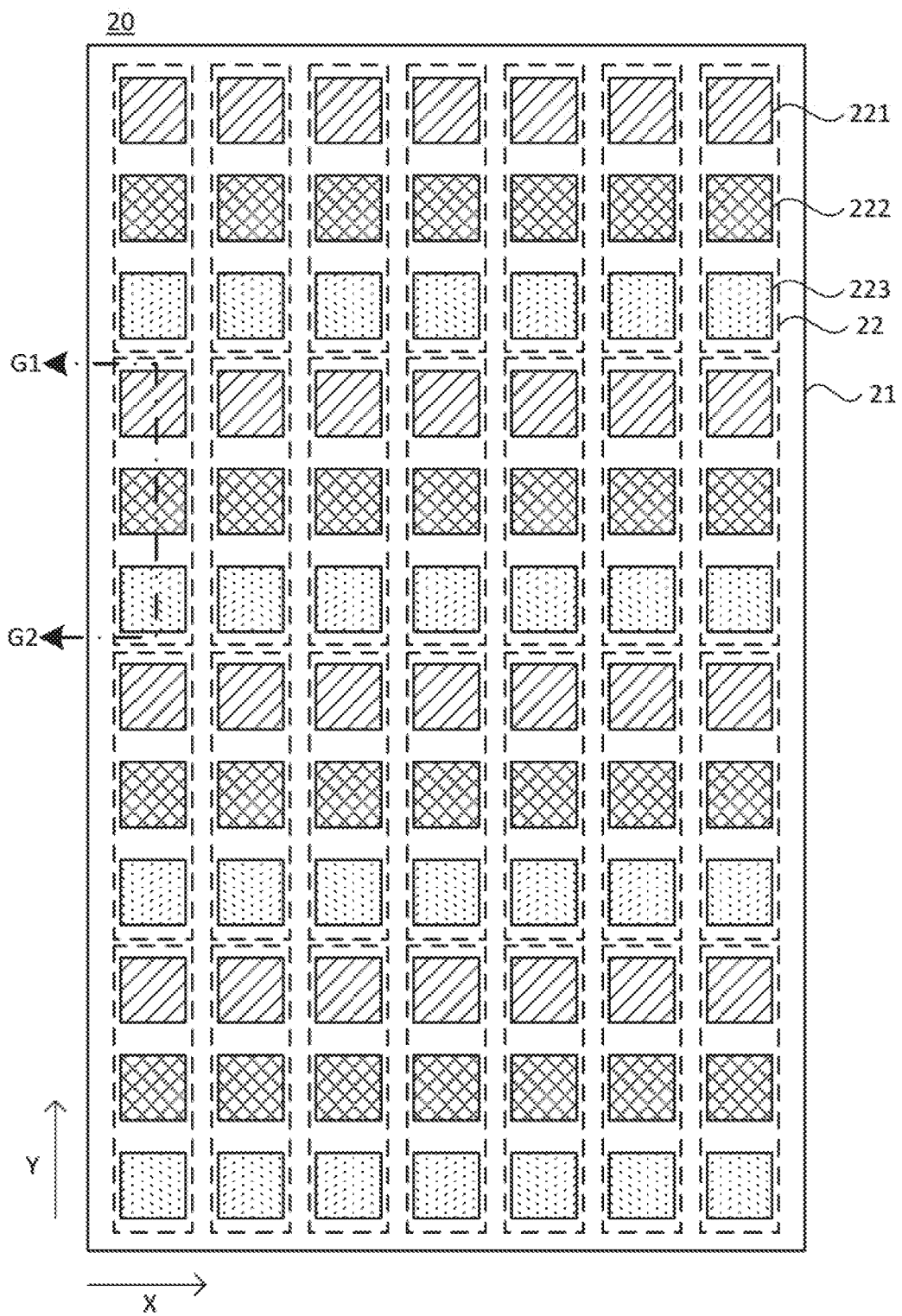
FIG. 6 is a schematic structural diagram of a display panel provided in an embodiment of the present application.

FIG. 6 is a schematic structural diagram of a display panel provided in an embodiment of the present application. Reference is made to FIG. 6, the display panel 20 includes a substrate 21 and a multiple pixel units 22 disposed one side of the substrate 21 and arranged in an array, where at least part of the pixel units 22 include any one of the organic light emitting diodes provided in the above embodiments. Therefore, the display panel 20 also has the beneficial effects that possessed by the above organic light emitting diode, which will not described in detail here.

The substrate 21 may be an array substrate for driving the pixel unit 22 to emit the light.

Exemplarily, FIG. 6 shows a row direction X and a column direction Y (the plane in which the row direction X and the column direction Y shown in FIG. 6 are disposed is the plane in which the substrate 21 is disposed), and shows the pixel units 22 arranged in 7 columns and 4 rows, each pixel unit 22 may include one blue sub-pixel 221, one red sub-pixel 222, and one green sub-pixel 223, meanwhile, the sub-pixels in each pixel unit 22 are arranged in the order of the blue sub-pixel 221, the red sub-pixel 222, and the green sub-pixel 223 in the column direction Y, which are merely an exemplary illustration of the display panel 20 provided in the present embodiment and are not limiting. In other embodiments, the array arrangement of the pixel units 22, as well as the numbers and arrangements of the blue sub-pixels 221, the red sub-pixels 222, and the green sub-pixels 223 in each pixel unit 22 may be set according to the actual requirements of the display panel 20, which is not limited in the embodiments of the present application.

At least one sub-pixel in each pixel unit 22 may adopt the structure of any one of the organic light emitting diodes provided in the above embodiments. Exemplarily, the blue sub-pixel 221 may adopt the structure of any one of the organic light emitting diodes provided in the above embodiments; or all of the three sub-pixels may adopt the structure of any one of the organic light emitting diodes provided in the above embodiments.

Figure 7:
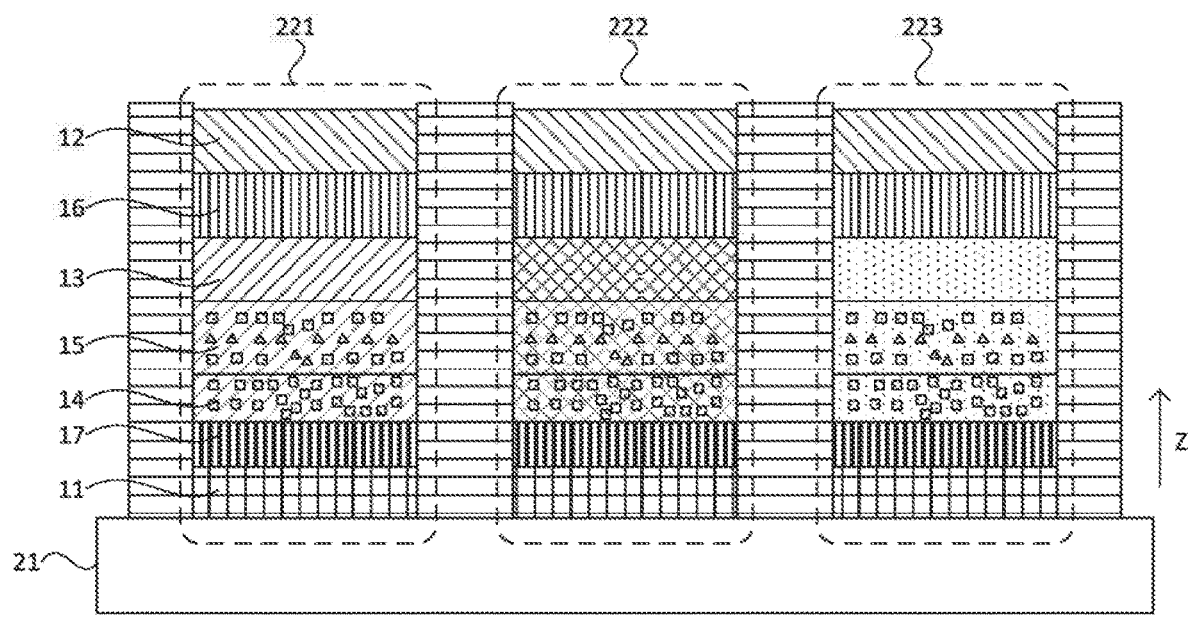
FIG. 7 is a schematic sectional structural diagram taken along G1-G2 of FIG. 6.

Exemplarily, FIG. 7 is a schematic sectional structural diagram taken along G1-G2 of FIG. 6. Reference is made to FIGS. 6 and 7, all of the three sub-pixels (including the blue sub-pixel 221, the red sub-pixel 222, and the green sub-pixel 223) in the pixel unit 22 includes the first electrode 11, the second carrier function layer 17, the electron blocking layer 14, the intermediate doped layer 15, the light emitting layer 13, the first carrier function layer 16, and the second electrode 12, which are disposed in a stacked manner in the perpendicular direction Z (the perpendicular direction Z is a direction perpendicular to a plane in which the row direction X and the column direction Y are disposed). The light emitting layers 13 in the blue sub-pixel 221, the red sub-pixel 222 and the green sub-pixel 223 include a light emitting host material and a light emitting guest material, the light emitting host material of each sub-pixel may be the same or different, and may be provided according to actual requirements of the display panel 20, which is not limited in the embodiments of the present application.

In an embodiment, the pixel unit 22 at a predetermined position in the multiple pixel units 22 may be provided to adopt the structure of the above-mentioned organic light emitting diode according to the display requirement of the display panel 20. The pixel units 22 at the predetermined positions may be provided according to the actual requirements of the display panel 20, which is not limited in the embodiments of the present application.

The specific type of the display panel 20 is not limited in the embodiments of the present application, and the present application may be applied to any display panel involving an electron and hole transport process. Exemplarily, the display panel may be an OLED display panel, a Quantum Dot Light Emitting Diodes (QLED) display panel, or other types of display panels known to those skilled in the art.

Figure 8:
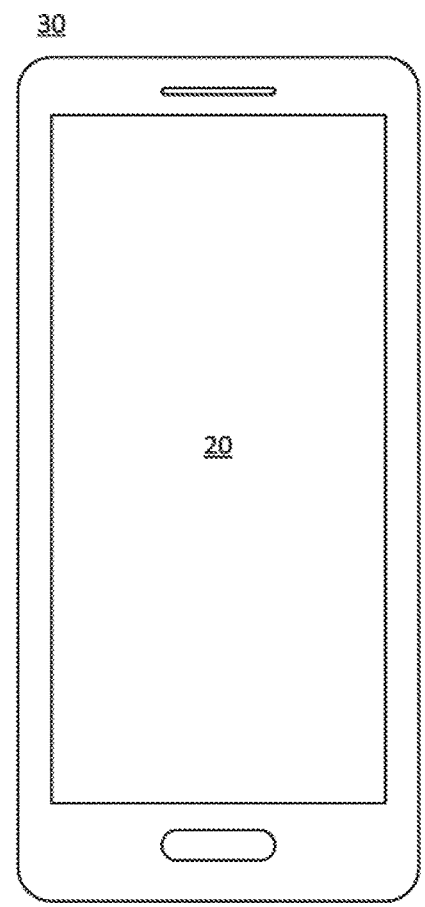
FIG. 8 is a schematic structural diagram of a display device provided in an embodiment of the present application.

The embodiments of the present application also provide a display device. FIG. 8 is a schematic structural diagram of a display device provided in an embodiment of the present application. Reference is made to FIG. 8, the display device 30 includes the display panel 20 provided in the above embodiments, therefore the display device 30 also has the beneficial effects that possessed by the above display panel 20, and thus the display device 30 also has the beneficial effects that possessed by the above organic light emitting diode, which may be understood with reference to the above description and will not be described in detail here.

Exemplarily, the display device 30 may be a mobile phone, a tablet computer, or other electronic display devices known to those skilled in the art, which is not limited in the embodiments of the present application.

The above-mentioned contents are only illustrative embodiments and the technical principles applied thereto of the present application. Various obvious variations, rearrangements combinations and substitutions may be made by those skilled in the art without departing from the concept of the present application, and the protection scope of the present application is defined by the protection scope of the appended claims.

What is claimed is:

1. An organic light emitting diode (OLED), comprising:
a first electrode;
a second electrode disposed oppositely to the first electrode;
a light emitting layer disposed between the first electrode and the second electrode;
an electron blocking layer disposed between the light emitting layer and the first electrodes; and
an intermediate doped layer, which is disposed between the light emitting layer and the electron blocking layer;
wherein a lowest unoccupied molecular orbital (LUMO) level of the electron blocking layer is higher than a LUMO level of a light emitting host material in the light emitting layer, a first level difference between the LUMO level of the electron blocking layer and the LUMO level of the light emitting host material in the light emitting layer is represented by A, and A≥0.4 eV;
wherein the intermediate doped layer comprises a light emitting host material and an electron blocking material, and the light emitting host material in the intermediate doped layer is the same as the light emitting host material in the light emitting layer;
the light emitting host material comprises at least one of 4,4-N,N-dicarbazole biphenyl, 9,10-dinaphthylanthracene, 4,4',4''-N,N',N''-tris(3-phenylcarbazole)aniline, 3,5-N,N'-dicarbazole benzene, or 4,4'-N,N'-dicarbazole-2,2'-dimethylbiphenyl; and
the electron blocking material comprises at least one of 4,4'-cyclohexylbis[N,N-bis(4-methylphenyl)aniline] or 4,4',4''-tris(carbazol-9-yl)triphenylamine.

2. The OLED of claim 1, wherein a highest occupied molecular orbital (HOMO) level of the electron blocking layer is higher than a HOMO level of the light emitting host material in the light emitting layer, a second level difference between the HOMO level of the electron blocking layer and the HOMO level of the light emitting host material in the light emitting layer is represented by B, and B≤0.2 eV.

3. The OLED of claim 1, wherein a thickness of the electron blocking layer is represented by C, and 3 nm≤C≤20 nm.

4. The OLED of claim 1, wherein the electron blocking layer comprises aromatic amine derivative.

5. The OLED of claim 1, wherein in the intermediate doped layer, a sum of a volume of the light emitting host material and a volume of the electron blocking material is represented by S, and the volume of the light emitting host material is represented by X, and a ratio of the volume of the light emitting host material to the volume of the electron blocking material satisfies 20%≤X/S≤80%.

6. The OLED of claim 5, wherein the ratio of the volume of the light emitting host material to the volume of the electron blocking material is: X/S=50%.

7. The OLED of claim 1, wherein a thickness of the intermediate doped layer is represented by E, and 0.1 nm≤E≤30 nm.

8. The OLED of claim 7, wherein the thickness E of the intermediate doped layer is 5 nm, 10 nm or 20 nm.

9. The OLED of claim 1, further comprising a first carrier function layer and a second carrier function layer;
the first carrier function layer is disposed between the light emitting layer and the second electrode, and the second carrier function layer is disposed between the first electrode and the electron blocking layer.

10. The OLED of claim 9, wherein the first carrier function layer comprises an electron injection layer, an electron transport layer, and a hole blocking layer which are disposed in a stacked manner in a direction from the second electrode towards the light emitting layer;
the second carrier function layer comprises a hole injection layer and a hole transport layer which are disposed in a stacked manner in a direction from the first electrode towards the electron blocking layer.

11. A display panel, comprising a substrate and a plurality of pixel units, wherein the pixel units are disposed on one side of the substrate and arranged in an array;
wherein at least part of the plurality of pixel units comprises the organic light emitting diode of claim 1.

12. A display device, comprising the display panel of claim 11.

* * * * *